United States Patent
McFeely et al.

(10) Patent No.: US 6,211,042 B1
(45) Date of Patent: Apr. 3, 2001

(54) GROWTH OF EPITAXIAL SEMICONDUCTOR FILMS IN PRESENCE OF REACTIVE METAL

(75) Inventors: Fenton Read McFeely, Ossining; Ismail Cevdet Noyan, Yorktown Heights, both of NY (US); John Jacob Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/170,621

(22) Filed: Oct. 13, 1998

(51) Int. Cl.⁷ .................................................. H01L 21/20
(52) U.S. Cl. ........................ 438/478; 438/222; 438/365
(58) Field of Search ................................... 438/222, 226, 438/365, 413, 478, 481, 682, 585, 522, 477

(56) References Cited

U.S. PATENT DOCUMENTS 5,789,312 * 8/1998 Buchanan et al. .................. 438/585
6,015,753 * 1/2000 Lin et al. ............................. 438/682

* cited by examiner

Primary Examiner—David Nelms
Assistant Examiner—Dung Ang Le
(74) Attorney, Agent, or Firm—Casey August

(57) ABSTRACT

A method is disclosed for forming an epitaxial layer of a semiconductor material over a metal structure disposed upon a surface of a semiconductor substrate, the metal being characterized by a negative Gibbs free energy for the formation of a compound of the metal and the semiconductor material. The method comprises the steps of: a) placing the substrate in a reactor vessel having a base pressure in the ultra high vacuum range, b) bringing the substrate to an elevated temperature, and c) flowing, over said substrate, a halogen-free precursor gas of molecules comprising the semiconductor material. Typically, the metal structure characterized by feature dimensions of less than 2.0 microns. Preferably, the metal is tungsten, the semiconductor material is silicon and the gas comprises a silane of the form $Si_nH_{(2n+2)}$, where n is a positive integer.

10 Claims, 1 Drawing Sheet

GROWTH OF EPITAXIAL SEMICONDUCTOR FILMS IN PRESENCE OF REACTIVE METAL

BACKGROUND OF THE INVENTION

I. Field of the Invention

The present invention relates to the integration of metal structures, typically wires, MOS gate electrodes, ground planes and the like into a matrix of single crystal semiconductor. An important purpose of the invention is to enable subsequent fabrication of integrated electronic devices comprised of monocrystalline, (as opposed to polycrystalline or amorphous) semiconductor and metal, along with such standard ingredients as dopants and grown or deposited insulators. FIG. 1 give a schematic of such an incorporated metal structure. An advantageous aspect of such an integrated structure is that the metal structure is disposed underneath the monocrystalline semiconductor material in which devices will subsequently be fabricated.

This invention provides an epitaxy method for achieving structures such as those depicted in FIG. 1 by providing a method to selectively grow an epitaxial semiconductor (e.g. Si or an alloy comprising Si, such as an alloy of the form $Si_xGe_{1-x}$, where x is in the range of zero to one) overlayer film in the presence of the metal structure, even though the metal tends to be reactive towards the precursor gas (e.g. silane, $SiH_4$ or a mixture of silane and another Group IV hydride such as $GeH_4$, germane) which comprises the semiconductor material (e.g. Si, $Si_xGe_{1-x}$) for the growth of the epitaxial semiconductor (e.g. silicon, silicon germanium) layer. The method of selective epitaxy disclosed herein, which may be called "reactive metal selective epitaxy" or "RMSE", is a fundamentally new process. It differs in three ways from the selective epitaxy commonly performed on Si in the presence of non-reactive insulators such as $SiO_2$ or $Si_3N_4$, which may be called "insulator selective epitaxy", or ISE herein. First, the RMSE method disclosed herein employs different reaction conditions for its operation, conditions which are the opposite of those one would select for ISE. Second, the new RMSE method operates in spite of an unfavorable thermodynamic gradient which does not exist for ISE. Third, the success of the new RMSE method is believed to be caused by a fundamentally different mechanism arising from the relative rates of surface and bulk diffusion for reactive intermediates, which is irrelevant for ISE.

II. Prior Art

The purpose of this section is to emphasize the distinction between the inventive method, RMSE (reactive metal selective epitaxy), and the well established prior art of ISE.

Insulator selective epitaxy (ISE) may be used to grow epitaxial silicon films 3 up and over an insulator such as SiO2, disposed upon a Si substrate, as shown in FIG. 2. For this purpose, two fundamentally different kinds of chemistries are used. The first type employs a silane for growth, either pure or diluted with hydrogen. The second, and preferred, practice is to add a halogen, typically chlorine, to the growth mixture by using a chlorinated silane in place of the silane. Only the first prior art method (silane-based) of ISE is appropriate for a direct comparison with RMSE.

In silane-based ISE a silane, or a silane mixed with hydrogen is flowed over a substrate at elevated temperature. The temperature must be sufficiently high for reactive dangling bonds to be present on the Si surface. These dangling bonds react with the silane, depositing silicon and liberating hydrogen. The minimum temperature to generate these active sites on the Si surface is about 550 C. At this temperature the probability for the silane, (or a species formed by a reaction among silane molecules in the gas phase or on the reactor walls) to decompose on the SiO2 surface is negligible, and selective epitaxy obtains. In practice, however, in order to increase the deposition rate of the epitaxial silicon, the process is run at temperatures as high as 750 C. However, at such temperatures the process is no longer very selective. Incubation times for the formation of polycrystalline nuclei can be as low as approximately one minute when the pressure of the silane is 10 mtorr. (see Katherine E. Violette et. al., Mat. Res. Soc. Symp. Proc. 334, 519 (1994)). This breakdown of selectivity at the higher temperatures necessary for rapid epitaxial growth can restrict the growth of epitaxial layers to thicknesses on the order of 0.05–0.1 microns. (see J. Murota et. al., Appl. Phys. Lett. 54, 1007 (1989), as well as K. Aketagawa and T. Tatsumi, J. Crystal Growth 11, 860 (1991)). In contrast, in the RMSE process the selectivity improves with increasing temperature in the 550 C to 750 C regime. In RMSE substrates can remain be processed for hours at 750 C without the formation of undesirable polycrystalline Si, and epitaxial layers several microns thick may be grown. Although the procedures for silane based ISE and the reactive metal selective epitaxy (RMSE) of the present invention bear a superficial similarity, they are fundamentally different processses because the metal surface reacts with the silane as an integral part of the successful RMSE process, while reaction of the silane with the insulator is only a prelude to the failure of the process. Moreover temperatures (e.g. 750 C) at which cause selectivity to fail within a matter of minutes for silane-based ISE are essential to the failure-free operation of RMSE.

Clearly, ISE using silanes is a marginal process at best, so in practice chlorinated silanes are used as a precursor. The temperature ranges and dependencies are much different than for silane-based ISE because a new factor is introduced. The Cl can etch away (remove into the gas phase) the incipient polysilicon nuclei from the SiO2, and this scavenging reaction requires high temperature (see Katherine E. Violette et. al., Mat. Res. Soc. Symp. Proc. 334, 519 (1994), supra). A detailed review of the various chemistries involved in ISE is given by S. M. Gates in Chemical Reviews 96 1519 (1996). In any event, no comparison between halogenated silane based ISE and RMSE is warranted because RMSE does not employ halogenated silanes. In fact, halogenated silanes would be highly undesirable for RMSE because of the reactivity of the metal with the halogen.

SUMMARY OF THE INVENTION

For the purposes of this application the term "metal" shall be taken to mean: 1) any of the metallic elements (elemental metals), or 2) any mixture of metallic elements, such as an alloy or intermetallic compound, provided that said mixture possesses the properties normally associated with metals. Specifically excluded from this definition of metal are certain compounds between elemental metals and non-metallic electronegative elements such as found in groups V and VI of the periodic table, e.g. oxygen, nitrogen, sulfur etc. . While certain of such compounds exhibit metallic conductivity, and are upon occasion referred to as "compound metals" or "metallic compounds" these are not substances to which we refer when employing the term "metal".

Broadly, the present invention provides a method of forming an epitaxial layer of a semiconductor material over a structure disposed upon a surface of a semiconductor substrate, the structure comprising a metal characterized by a negative Gibbs free energy for the formation of a compound of said metal and said semiconductor material, the method comprising the steps of:

a) placing said substrate in a reactor vessel having a base pressure in the ultra high vacuum range, b) bringing said substrate to an elevated temperature, and c) flowing, over said substrate, a halogen-free precursor gas of molecules comprising said semiconductor material.

Preferably the elevated temperature should be sufficient for a blank clean substrate of the semiconductor material placed in the reactor and subjected to a flow of the halogen-free precursor gas to grow epitaxially on said blank clean substrate at a rate greater than 1.0 angstroms per minute.

The metal structure preferably comprises features characterized by dimensions of less than 2.0 microns.

According to a preferred embodiment, the metal of the structure is tungsten, the semiconductor material comprises silicon and the precursor gas comprises a silane of the form $Si_nH_{(2n+2)}$, where n is a positive integer. A common preferred silane is $SiH_4$. The elevated temperature is preferably in the range of 700 to 900 degrees Celsius, and the ultra high vacuum base pressure of the reactor is no more than $10^{-8}$ torr. at operating temperature.

BRIEF DESCRIPTION OF THE DRAWINGS

The invention will be better understood from the accompanying drawings wherein.

DETAILED DESCRIPTION

Figure 1:
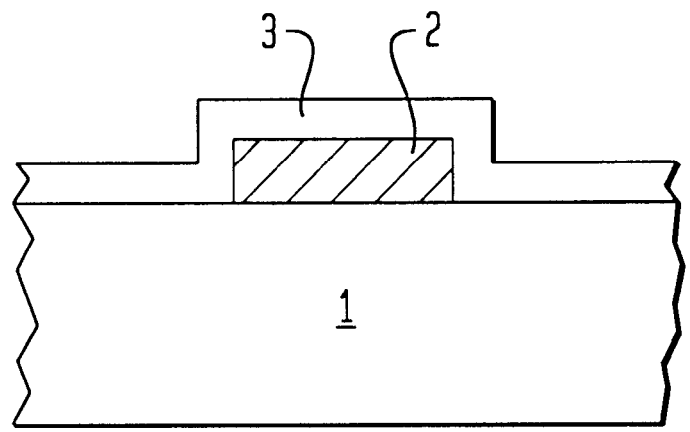
FIG. 1 is a sectional view of a semiconductor substrate having a metal structure thereon, with an epitaxial layer of semiconductor material formed over the metal structure in accordance with an embodiment of the present invention.

FIG. 1 shows a substrate 1 of a semiconductor material (e.g. Si) having a metal structure 2 of patterned lines or the like thereon. By carrying out the process steps described below, an epitaxial layer 3 of the semiconductor material can be formed, according to the invention, over the surface of substrate 1 and over metal structure 2.

A description of the method steps used in carrying out an embodiment of the RMSE method to produce a structure, such as is shown in FIG. 1, using tungsten (W) as the metal component, will now be described with reference to a number of standard fabrication processes well known to those versed in the art. Analyses of the resulting structures and of related test structures will then be reviewed to gain potentially useful insights into the method of operation of the new selective epitaxial RMSE process.

Process Steps:

1. A substrate 1 comprising Si is inserted into a cold wall, UHV CVD reactor, brought to a temperature of 400–600 C, and exposed to $W(CO_6)$ vapor in order to deposit a blanket W film from which a metal structure 2 can subsequently be formed. For test purposes this film was approximately 0.5 microns thick, but may vary as desired. (This W deposition was carried out as described by Buchanan et. al. U.S. Pat. No. 5,789,312.) It is essential for this application that the W deposition be carried out in such a manner as to produce a tungsten film which will successfully withstand the elevated temperatures required in subsequent steps.

2. The W film is then patterned with a structure 1, and undesired areas are etched away to lay bare the underlying Si which is to serve as the template for epitaxial growth. The metal structure's features were characterized by dimensions of less than 2.0 microns. In our specific test case, metal structure 2 comprised simple patterns of parallel lines of width 0.7–2.0 microns spaced 0.7–2.0 microns apart.

3. The W-patterned substrate 1 was etched in dilute HF to remove native oxide from the silicon and produce a stable hydrogen terminated Si surface suitable for the initiation of epitaxial growth.

4. The substrate 1, approximately 1 cm×2 cm in size, was introduced into a hot wall UHV CVD reactor typical of those used for epitaxial silicon growth. The reactor temperature was 750 degrees Celsius and the base pressure at 750 degrees Celsius was less than $10^{-9}$ torr. Neat (undiluted) silane ($SiH_4$) was flowed over the sample with a flow rate of 1 std. cc/min. The reactor total pressure during deposition was 1 mtorr, and the total reactor volume was approximately 4 liters. Exessively high pressures of Silane must be avoided. In our reactor the process failed at a pressure of 20 mtorr, perhaps due to reactions of silane in the gas phase and subsequent homogeneous nucleation. At marginal pressures, 5–10 mtorr, a slower flow rate was found to be benificial.

5. Photographs were taken from a scanning electron microscope (SEM) image of the processed substrate and showed the faceted growth of epitaxial silicon 3 up from the silicon substrate and over the W wires. Analysis by x-ray diffraction confirmed that this material 3 was epitaxial. This structure may now be polished to the desired degree of flatness by standard methods.

Auxiliary Tests of the Process

The purpose of these auxiliary tests is to demonstrate that the above-described reactive metal selective epitaxy process according to the invention is fundamentally different from the insulator selective epitaxy process known from prior art, despite their superficial similarity.

Figure 2:
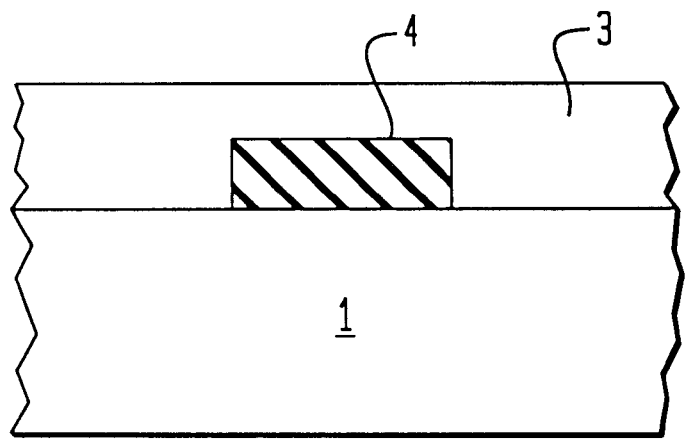
FIG. 2 is a sectional view of a semiconductor substrate having insulating structures formed thereon, with an epitaxial layer of semiconductor material formed over the insulating structures in accordance with the prior art ISE method.

1. Process steps 1–4 were repeated but with reactor temperatures (step 4) in the range of 500–650 C for a variety of processing times, as is done in the prior art ISE process. In no case was epitaxial overgrowth over metal structures (e.g. tungsten wires) ever achieved. SEM images of the substrates clearly showed deposition and growth of polycrystalline silicon grains on the tungsten wires. This was confirmed by x-ray diffraction analysis, which also revealed the presence of WSi2. This test shows that our process has a lower critical temperature, below which it does not work. In contrast ISE never possesses such a lower critical temperature when epitaxial silicon 3 is grown over insulator 4, as shown in FIG. 2. To be sure, reducing the processing temperature for ISE will lower the growth rate of the semiconductor 3 over the insulator 4, but it never causes the precursor gas to react with, or deposit semiconductor on, the undesired (insulator) surface.

Viewed from a mechanistic perspective, this test demonstrates conclusively that the achievement of epi overgrowth at 750 C does not depend upon the metal being unreactive towards SiH4, as would be the case if our process had the same mechanism of operation as ISE. Lowering the temperature would make the reaction of $SiH_4$ with W less, not more, likely.

2. Process steps 1–4 were repeated exactly (reactor temperature of 750 C), but with a blanket W (tungsten) film, instead of the thin wire arrays. In this case, x-ray diffraction revealed substantial polysilicon deposition and tungsten silicide formation. This confirms the conclusion reached on the basis of auxiliary test 1, that the tungsten is inherently highly reactive with the silane at the epitaxial growth temperature, in contrast to halogen-free ISE where the insulator and the precursor gas are, to the extent that the process works, negligibly reactive towards one another. In view of the fact that epitaxial growth can in fact be achieved on the wire structures leads to the conclusion that it is the proximity to the silicon surface between the wires that suppresses the nucleation and growth of polysilicon and /or silicide on the tungsten wires. In contrast, halogen-free ISE, depending as it does on the inherent lack of reactivity between the precursor gas and the insulator, shows no such proximity effect.

Taken together, auxiliary tests 1 and 2 show conclusively that the essential precondition for successful halogen-free ISE, a negligable interation between the precursor gas and the surface not to be deposited upon, does not obtain. Thus our process exhibits a lower critical temperature and a proximity effect, both of which are unknown for halogen-free ISE. Our process thus operates by a fundamentally different mechanism.

Possible Mechanism of Operation of the Novel Epitaxial Process

The success of the RMSE epitaxial growth process and the results of the auxiliary tests suggests the following possible explanation for the mechanism of the process. For simplicity, the process may be separated into an initial and steady state regime.

Initially reactive halogen-free precursor gas (e.g. a silane such as $SiH_4$ or any other silane of the form $Si_nH_{(2n+2)}$, where n is a positive integer) incident upon the silicon-tungsten structure react with both materials. Indeed the most thermodynamically favorable reaction is with tungsten to produce $WSi_2$, however, the silicon surface, being bare of hydrogen at this temperature, provides a sufficient density of highly reactive dangling bond sites to bind the reactive precursor gas and begin the growth process. In this regime both the tungsten and silicon surfaces are highly reactive; $SiH_4$ molecules incident from the gas phase, if they are not reflected back immediately, react with the surface (either tungsten or silicon) effectively whereever they land and have a very short diffusion length on the surface before they are irreversible reacted and trapped.

Stage 1 continues until the tungsten surface is coated with a thin "skin" of W silicide. (This skin may be as thin as a few atomic layers). At this point the situation changes for precursor gas molecules arriving at the W surface. The surface of the tungsten is now silicon-saturated and there are no reactive sites available. Further reaction with the W may only occur by diffusing through the newly formed silicide skin layer to reach the buried unreacted W. Such a process is believed to require surmounting a substantial activation energy barrier, and the rate of this process will decrease dramatically as the skin layer thickness increases. Lacking reactive sites on the surface and facing a large barrier to diffuse through to the underlying unreacted W, the diffusion length of adsorbed silicon precursor ($SiH_4$) molecules on this surface becomes larger and larger. Stage 2, the steady state regime, begins when the Si skin layer is sufficiently thick such that the most likely fate of a silicon containing molecule is to either diffuse to the silicon surface and react as in stage 1, (or desorb back to the gas phase, if that is possible for the silane molecule in question). Thus, the silicon surface continues to grow, but the tungsten surface suffers no further alteration.

This possible mechanism may explain why reaction at lower temperature (auxiliary test 1), which is desirable for ISE is such a disaster for our process. The initial stage would proceed largely as before to form a $WSi_2$ layer, but if the temperature is insufficient to promote high surface mobility of the chemisorbed species, they will not be able to diffuse to the silicon surface. Sooner or later the silane molecules will react with other silicon-based reaction intermediates (e.g. Si, $SiH_2$, $SiH_3$) chemisorbed in their immediate vicinity and form nuclei for polycrystalline growth. It is believed that this problem will only be exacerbated if the temperature falls to the point (T<550 C or so) where the Silicon surface is largely hydrogen covered and unreactive. This would allow two-way diffusion of Si back onto the W surface.

The mechanism above may also explain auxiliary test 2. If there are no Si surfaces to trap and incorporate adsorbed silicon-based reaction intermediates in the immediate vicinity of the W, as in a blanket film, polysilicon nucleation and growth is inevitable; the no matter what the diffusion length the chemisorbed silicon species have on the surface, sooner or later they will meet and react with one another or with the W to form silicides, as there is no alternative.

The fundamental fact distinguishing reactive metal selective epitaxy (RMSE) from ISE is believed to be the existence of an additional thermodynamic driving force for the reaction of the silane gas with the metal. This driving force has its origins in a reaction which can be written in the form $$xM+ySiH_4 => M_xSi_y+2yH_2 \quad (1)$$

and is characterized by a Gibbs free energy change $\Delta G1$, where x and y are stoichiometric coefficients which depend on the particular metal silicide which is being formed.

On an inert insulator as in ISE or on the silicon surface which is being epitaxially grown, the only reaction is $$ySiH_4 => ySi+2yH_2 \quad (2)$$

characterized by a Gibbs free energy change $\Delta G2$.

The difference in free energy changes in reacting y moles of SiH4 with the metal and decomposing them on the growing Si surface is given by the arithmetic difference of the free energies of reactions 1 and 2. Thus, $\Delta G_{total}=\Delta G_1-\Delta G_2$. The chemical equations may be likewise subtracted to yield $$xM+ySi => M_xSi_y. \quad (3)$$

This serves to identify the difference in thermodynamic driving force for reaction with the metal with the free energy of formation of the metal silicide, that is $\Delta G_{total}=\Delta G_f(M_xSi_y)$. Therefore, it is believed that whenever the metal is such that the free energy of formation of its silicide or suicides is NEGATIVE, the reaction between the silane and the bare metal surface will occur, initiating the sequence of events comprising the reactive metal selective epitaxy mechanism. All of the hereinbefore defined metals (which include elemental metals and mixtures, such as alloys, thereof) are believed not only to suit to the purpose of forming the structures described above, but also to possess this property of having a negative free energy for the formation of a metal silicide.

One proviso should be made with regard to the latter point. The thermodynamic favorability of a reaction constitutes a necessary, but not sufficient condition that it will take place to an appreciable extent. If activation energy barriers are present the anticipated reaction need not proceed. Such barriers may, for example, result from the necessity of breaking strong chemical bonds before even stronger chemical bonds can be re-formed. For the surfaces of clean metals, this is not a problem, as no strong bonds in the substrate need be broken to initiate reaction; such surfaces are well known to be highly reactive. Therefore, if epitaxy can successfully be achieved with any metal patterned on a semiconductor substrate, the mechanism for this process should be substantially the same as we have shown for the case of tungsten on silicon. The criterion is straightforward. For a metal, if $\Delta G_r$ of the metal silicide is negative, the new RSME process should be operative.

By contrast, if instead of a metal as defined herein, a compound exhibiting metallic conductivity (e.g. as do some metal oxides or nitrides) were used instead, it would not be clear a priori if the novel RSME process would be operative, regardless of the thermodynamics of silicide formation. The necessity of breaking strong metal-oxygen or metal-nitrogen bonds in order to form the silicide might lead to an activation energy barrier for reaction which would cause the ISE process to be applied. As will be understood, the inventive method hereof is not intended to apply to the latter materials.

While the present invention has been described with reference to preferred embodiments thereof in order to facilitate a better understanding of the invention, those skilled in the art will recognize that the invention can be embodied in various ways without departing from the scope and spirit of the invention as set forth in the appended claims.

What is claimed is:

1. A method of forming an epitaxial layer of a semiconductor material over a structure disposed upon a surface of a semiconductor substrate, said structure comprising a metal characterized by a negative Gibbs free energy for the formation of a compound of said metal and said semiconductor material, said method comprising the steps of:

a) placing said substrate in a reactor vessel having a base pressure in the ultra high vacuum range, b) bringing said substrate to an elevated temperature, and c) flowing, over said substrate, a halogen-free precursor gas of molecules comprising said semiconductor material.

2. A method as set forth in claim 1, said elevated temperature being sufficient for a blank clean substrate of said semiconductor material placed in said reactor and subjected to a flow of said precursor gas to grow epitaxially on said blank clean substrate at a rate greater than 1.0 angstroms per minute.

3. A method as set forth in claim 1, wherein said structure comprises features characterized by dimensions of less than 2.0 microns.

4. A method as set forth in claim 1, wherein said metal is tungsten, said semiconductor material comprises silicon and said gas comprises a silane of the form $Si_nH_{(2n+2)}$, where n is a positive integer.

5. A method as set forth in claim 3, wherein said metal is tungsten, said semiconductor material comprises silicon and said gas comprises a silane of the form $Si_nH_{(2n+2)}$, where n is a positive integer.

6. A method as set forth in claim 4, wherein said elevated temperature is in the range of 700 to 900 degrees Celsius.

7. A method as set forth in claim 5, wherein said elevated temperature is in the range of 700 to 900 degrees Celsius.

8. A method as set forth in claim 5, wherein said elevated temperature is about 750 degrees Celsius.

9. A method as set forth in claim 1, 5 or 7, wherein said base pressure is no more than $10^{-8}$ torr.

10. A method as set forth in claim 4, wherein the semiconductor material is SiGe, and wherein said gas comprises a mixture of silanes and germanes.

* * * * *